Figure 1:
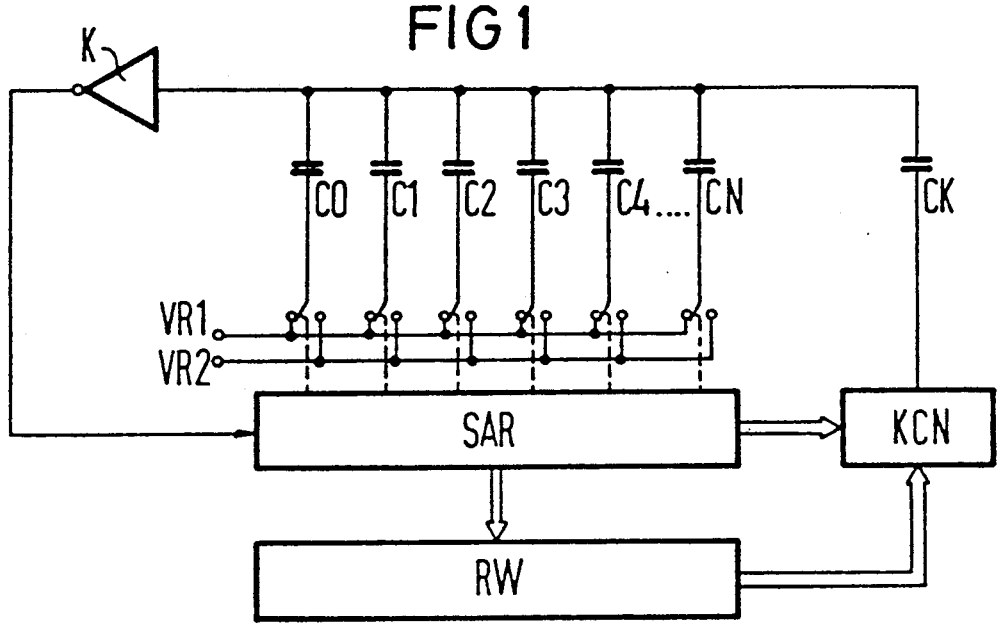

United States Patent [19]

Kuttner

[11] Patent Number: 5,012,241
[45] Date of Patent: Apr. 30, 1991

[54] METHOD FOR DETERMINING AND PROCESSING CORRECTION VALUES FOR SELF-CALIBRATING A/D AND D/A CONVERTERS, AND CALCULATING REGISTER FOR PERFORMING THE METHOD

[75] Inventor: Franz Kuttner, Villach, Austria

[73] Assignee: Siemens Aktiengesellschaft, Munich, Fed. Rep. of Germany

[21] Appl. No.: 415,059

[22] Filed: Sep. 29, 1989

[30] Foreign Application Priority Data

Sep. 30, 1988 [EP] European Pat. Off. ........ 88116235.8

[51] Int. Cl.$^5$ ............................................ H03M 1/10
[52] U.S. Cl. ..................................... 341/120; 341/118
[58] Field of Search ............... 341/120, 121, 118, 119, 341/141, 161, 162

[56] References Cited

U.S. PATENT DOCUMENTS

| | | | |
|---|---|---|---|
| 3,483,550 | 12/1969 | Max | 341/118 |
| 4,340,882 | 7/1982 | Maio et al. | 341/118 |
| 4,354,245 | 10/1982 | Delegue | 341/141 |
| 4,399,426 | 8/1983 | Tan | 341/120 |
| 4,451,821 | 5/1984 | Domogalla | 341/120 |
| 4,894,656 | 1/1990 | Hwang et al. | 341/120 |
| 4,908,621 | 3/1990 | Polonio et al. | 341/161 |

Primary Examiner—Mark J. Reinhart
Assistant Examiner—Randy W. Gibson
Attorney, Agent, or Firm—Herbert L. Lerner; Laurence A. Greenberg

[57] ABSTRACT

A self-calibrating A/D and D/A converter includes a binary weighted converter network, a calibrating and correction network, a calculating register, and a successive approximation register controlling the converter network and controlling the calibrating and correction network with the calculating register. A method and calculating register for determining and processing correction values for the converter according to the principle of successive approximation include, in a calibration phase, beginning with the most significant network element, measuring error terms with the calibration and correction network for each weighted network element of the converter network, by comparison with the sum of all of the lower-weighted network elements; calculating a correction value for each network element of the converter network as one-half the difference of the associated error term and the sum of all of the correction values for higher-weighted network elements, with the calculating register having the sum register; storing each calculated correction value in a memory; in a conversion phase, beginning with the most significant network element, retrieving the associated correction value from the memory and adding the correction value to the contents of the sum register upon setting of a weighted network element, outputting the correction value at the calibration and correction network; and adding the correction value to the contents of the sum register or discarding the correction value as a function of a comparator decision.

9 Claims, 1 Drawing Sheet

METHOD FOR DETERMINING AND PROCESSING CORRECTION VALUES FOR SELF-CALIBRATING A/D AND D/A CONVERTERS, AND CALCULATING REGISTER FOR PERFORMING THE METHOD

The invention relates to a method and calculating register for determining and processing correction values for self-calibrating A/D and D/A converters according to the principle of successive approximation, in which a successive approximation register on one hand controls a binary weighted converter network and on the other hand controls a calibrating and correction network in combination with the calculating register.

The most important and most critical interface between different types of systems is usually the connection between the analog and digital portions of the systems. The interface between a digital circuit and an analog circuit requires a D/A converter, while the interface between and analog circuit and a digital circuit correspondingly requires an A/D converter. A D/A converter can be constructed by using an A/D converter, and vice versa. An ideal converter, which naturally does not exist in actuality, would convert a digital or analog signal, as applicable, into an analog or digital signal without delay and without error.

In many types of A/D and D/A converters, reference elements are needed which derive further variables that are used for a conversion from a predetermined reference variable. These reference elements form a weighted network. In practice, the weighted networks are usually achieved by means of resistors, capacitors or transistors. Such converters operate, for instance, by the method of successive approximation. A converter with charge redistribution can be considered an example of such a converter in which the weighted network is formed of capacitors. In converters having a weighted network, it is important that the weighted elements be at a precisely predetermined ratio to one another. For high-precision converters the weighted elements must be highly precise. Problems arise, however, because the weighted elements cannot be manufactured with sufficient precision. typically, a correction is therefore made, for instance, by trimming or by using read-only memories, but these methods have disadvantages.

Another possibility for calibrating A/D or D/A converters is that of self-calibration and is, for instance, known from U.S. Pat. No. 4,451,821 to Domogalla, and the publication by H.S. Lee and D. Hodges, entitled "Self-Calibration Technique for A/D Converters", IEEE Transactions on Circuits and Systems, Vol. CAS-30, No. 3, March 1983, page 188.

The prerequisite for the self-calibrating method of successive approximation described therein is a binary weighted network, in which the smallest element is present in duplicate. With such a device, in the ideal case a weighted element is identically equal to the sum of all of the bits of lesser weight or significance. In such a self-calibration, the ratio of the reference elements to one another is measured during the calibration and converted into values with which the reference elements can be corrected.

In self-calibrating converters having a capacitive converter network that are often used, the deviation from the sum of the capacitances of all of the lower weighted capacitors is ascertained in increments for each capacitor in the network. However, self-calibrating converters can be made not only with capacitors but with other network elements as well. From this difference, which is ideally zero, it is clearly possible to determine the weighting error to be assigned to each capacitor, and this error can be stored in memory and then used in a conversion operation for correcting the result. Usually, this weighting error is ascertained with the aid of a calibration and correction network. In order to assign the correction weights to the various weighted reference elements, an arithmetic unit is required. This unit may, for instance, include a microcomputer, but often that is too expensive. Another option is to use a calculating register.

It is accordingly an object of the invention to provide a method for determining and processing correction values for self-calibrating A/D and D/A converters and a calculating register for performing the method, which overcome the hereinafore-mentioned disadvantages of the heretofore-known methods and devices of this general type, which functions precisely and is relatively inexpensive.

With the foregoing and other objects in view there is provided, in accordance with the invention, in self-calibrating A/D and D/A converters including a binary weighted converter network having weighted network elements, a calibrating and correction network, a calculating register having a sum register, and a successive approximation register controlling the binary weighted converter network and controlling the calibrating and correction network in combination with the recalculating register, a method for determining and processing correction values for the converters according to the principle of successive approximation, which comprises in a calilbration phase, beginning with the most significant network element, measuring error terms with the calibration and correction network for each weighted network element of the converter network, by comparison with the sum of all of the lower-weighted network elements; calculating a correction value for each weighted network element of the converter network as one-half the difference of the associated error term and the sum of all of the correction values for higher-weighted network elements, with the calculating register having the sum register; storing each calculated correction value in a memory; in a conversion phase, beginning with the most significant network element, retrieving the associated correction value from the memory and adding the correction value to the contents of the sum register upon setting of a weighted network element, outputting the correction value at the calibration and correction network; and adding the correction value to the contents of the sum register or discarding the correction value as a function of a comparator decision.

In accordance with another mode of the invention, there is provided a method which comprises, in the calibration phase, incrementally subtracting the contents of the sum register from each error term with the aid of an adder; dividing the result by two with a further register; and temporarily storing the quotient forming the correction value in the further register.

In accordance with a further mode of the invention, there is provided a method which comprises effecting the subtraction by addition of the two's complement of the contents of the sum register.

In accordance with an added mode of the invention there is provided a method which comprises adding the correction value temporarily stored in the further register to the contents of the sum register and temporarily storing the correction value as a new value in the sum register, and subsequently performing the next calibration step.

In accordance with an additional mode of the invention, there is provided a method which comprises reading the contents of the sum or buffer register through a controllable buffer memory into an adder, connecting the buffer memory transparently during the calibration phase with flow control means and connecting the buffer memory non-transparently in the conversion phase during a bit decision of the successive approximation register, except in the event of a bit decision made by the successive approximation register in favor of a logical 1, which effects a brief transparent saturation conduction.

With the objects of the invention in view, there is also provided, in a self-calibrating A/D and D/A converter assembly including a binary weighted converter network, a calibrating and correction network, a calculating register for determining and processing correction values for the converter, a successive approximation register controlling the binary weighted converter network and controlling the calibrating and correction network in combination with the calculating register, and a memory, the calculating register comprising an adder having an input side and an output side, a sum register and a further register connected to the output side of the adder, a multiplexer connected to the further register, to the successive approximation register and to the memory, and flow control means for connecting the sum register and the multiplexer to the input side of the adder.

In accordance with yet another feature of the invention, the sum register has outputs, and the adder has inputs associated with the sum register and a further transfer input, and there is provided an exclusive OR logic connected between the outputs of the sum register and the inputs of the adder associated with the sum register.

In accordance with a concomitant feature of the invention, the converter includes a comparator, and the exclusive OR logic has an output side, and there is provided a buffer memory controlled by the comparator and connected to the output side of the exclusive OR logic.

An advantage of the invention is that the correction values can be taken directly into account and already processed in the calibration or conversion phase. Precautions are taken with respect to the occurrence of metastable states. This lends a further advantage which is that the converter precision can be improved considerably. The invention is not restricted to certain self-calibrating converters.

Other features which are considered as characteristic for the invention are set forth in the appended claims.

Although the invention is illustrated and described herein as embodied in a method for determining and processing correction values for self-calibrating A/D and D/A converters, and a calculating register for performing the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
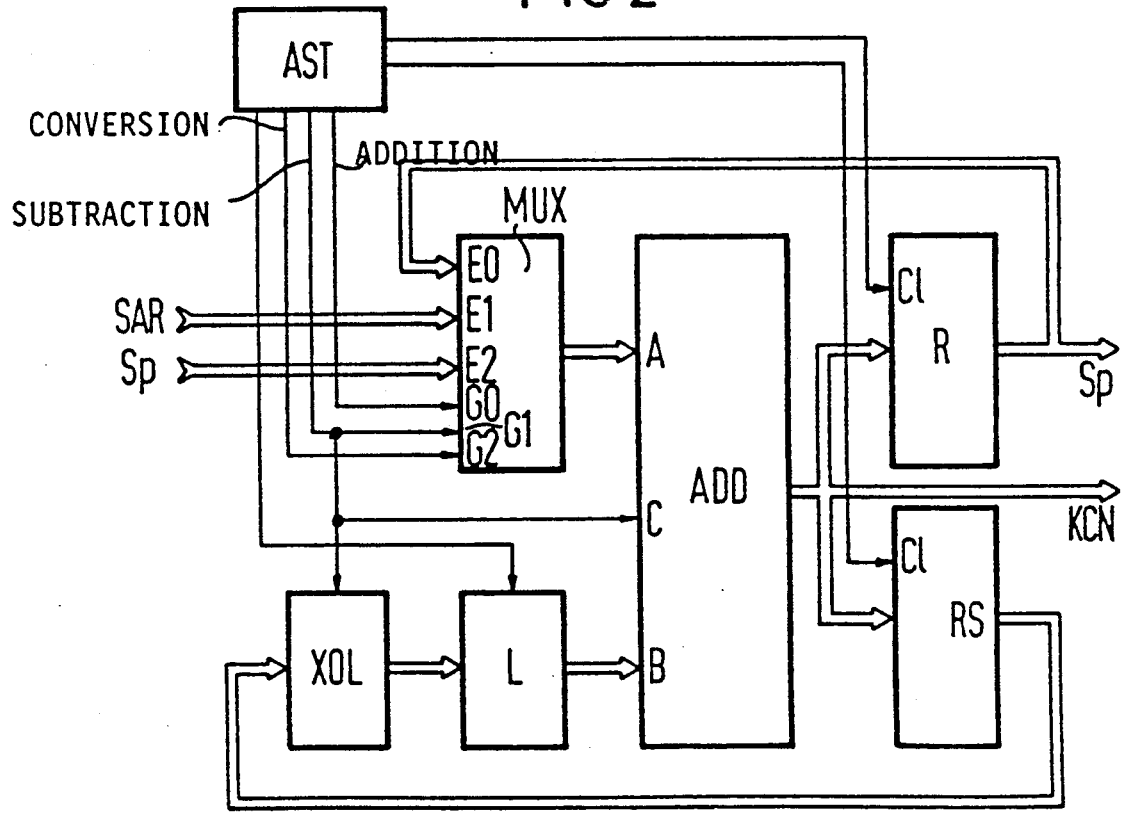

FIG. 1 is a basic schematic and block circuit diagram of a self-calibrating converter with a capacitive network; and FIG. 2 is a block circuit diagram of an exemplary embodiment of a calculating register according to the invention for performing the method according to the invention.

Referring now to the figures of the drawing in detail and first, particularly, to FIG. 1 thereof, there is seen a self-calibrating converter having a capacitively weighted converter network, the weighting of which is preferably binary. The network includes capacitors $C_i$, where i represents values from 0–N. Since the capacitor $C0$ is of equal magnitude to the capacitor $C1$, the smallest capacitor is present in duplicate. One connection of each of the weighted capacitors is carried to a common node point, and the node point is carried to one input of a comparator K. The output of the comparator K controls a successive approximation register SAR, which in turn controls a non-illustrated switch network with which the weighted converter capacitors can be connected to respective reference potentials VR1 and VR2. Connected to the output side of the successive approximation register is a calculating register RW, which controls a calibration and correction network KCN together with the successive approximation register SAR. The output of the calibration and correction network KCN is connected through a coupling capacitor CK to the node point and to the comparator input. Preferably, the calibration and correction network includes a calibrating D/A converter, which likewise contains a weighted network, such as a resistor network or preferably a capacitive network.

An increasing error component arises in the conversion with increasing resolution of the A/D and D/A converters, because the capacitors are not ideally weighted to one another. For the weighted converter network, one capacitor is regarded as being equal to the sum of all of the smaller capacitors, plus an error term. In this way, an equation system can be set up in which $C1 = C0 + a$ first error term E1, $C2 =$ the sum of C0, C1 and a second error term E2, and so forth. The capacitor CN is then equal to the sum of the capacitors C0 through $C(N-1)$, plus an error term EN. In this way, N equations with N error terms E1–EN are obtained, and the error terms are measured with the aid of the calibration and correction network in the calibration of the converter, by comparison of each capacitor of the converter network with the sum of all of the smaller capacitors.

Correction values must then be ascertained from these error terms for each weighted capacitor, which then are intended to correct the capacitance of a capacitor each time the associated capacitor is selected in the conversion operation. The correction value for an arbitrary capacitor is calculated as one-half the difference between the associated error term and the sum of all of the correction values for the higher-weighted capacitors. In this way, the correction value KWN for the capacitor CN is first determined and is equal to one-half the error term EN. The correction value KW (N−1) for the capacitor C (N−1) is obtained from the error term E (N−1), minus the correction value KWN for the capacitor CN, and the difference is divided by two.

In this way, all of the correction values are ascertained successively and stored in memory.

During a normal conversion, the converter functions like a standard successive approximation converter, but with the calibration and correction network KCN a corresponding correction charge is imposed on the capacitive converter network in accordance with the set bit pattern at the weighted converter network. The calculating register RW then performs the task of calculating the correction values by the formula given during the calibration and calculating the sum of the correction values during the normal conversion.

As is shown in FIG. 2, the calculating register according to the invention includes an adder ADD, having an output side to which two register banks, namely a sum register RS and a further register R, are connected. The sum register RS serves for the buffer storage of sums of correction values, and the further register R serves as a buffer memory for individual calculated correction values. The output side of the sum register RS is connected to a bus input B of the adder ADD. More specifically, the outputs of the sum register RS are followed by exclusive OR gates XOL and a buffer memory or latch L. The latch L is controllable by a flow control AST, so that it can be connected transparently or on-transparently without memory action, and in that case performs the function of saturated conduction or buffer storage.

A further bus input A of the adder ADD is triggered with the aid of a multiplexer MUX, with the aid of which the outputs of the further register R, the output of the successive approximation register SAR or the outputs of a non-illustrated memory Sp can be selectively switched through to the adder, in the form of a bus. The outputs of the further register R also lead to memory inputs of the non-illustrated memory Sp. The output connections of the adder ADD lead to the calibration and correction network KCN in the form of a bus. The control of the calculating register is performed by the flow control means AST, which generate both the required clock signals and the control signals for the multiplexer MUX and the exclusive OR gates. In the "addition" mode, the multiplexer MUX switches through the outputs of the further register R, in the "subtraction" mode, it switches through the outputs of the successive approximation register, and in the "conversion" mode it switches through the memory outputs of the non-illustrated memory Sp. In the subtraction mode, the exclusive OR gates are switched over, and a logical 1 is applied to a transfer input C of the adder ADD. The subtraction itself is effected in such a way that the two's complement of the memory contents of the sum register is formed. To this end, the contents of the sum register RS is applied in an inverted form to the inputs B of the adder ADD, and a logical 1 is added through the transfer input C. The necessary division by two is carried out effected by suitable wiring of the registers RS and R. To this end, the outputs of the further register R associated with the various bit places are fed back again, shifted by one weighting, to the inputs of the register R.

The calculating register according to FIG. 2 functions as follows. At the beginning of the calibration phase, the sum register RS and the further register R are set to zero. The highest-weighted capacitor CN of the converter network is compared with the sum of the remaining weighted capacitors, and the error term EN is thus ascertained. The multiplexer MUX at the input of the calculating register switches the error term RN emitted by the successive approximation register SAR to the bus input A of the adder ADD. The contents of the sum register RS, which is still zero in the first calibration operation, is subtracted from this error term EN to form the two's complement. The result of subtraction is divided by two, which can, for instance, be carried out in the manner described by providing suitable wiring. The quotient forms the correction value to be calculated, which is stored in memory in the further register R and is also stored as the calculated correction KWN in the memory Sp.

Then, the outputs of the further register R are connected to the bus input A of the adder with the aid of the multiplexer MUX. The outputs of the sum register RS are present at the thus input B of the adder ADD. Both values are added together and yield the first intermediate result, which is equivalent to the correction value KWN in the first calibration operation, and is then stored in the sum register RS.

The second time the operation is performed, the second error term E (N−1) is measured and applied to the bus input A of the adder. The sum of the correction values stored in the sum register, that is the value KWN in this example, is subtracted from this error term. The result is divided by two, as described, and the quotient is equivalent to the next correction value KW (N−1), which is again temporarily stored in the further register R and stored in memory as the second correction value in the memory SP. Next, the contents of both registers R and RS are again added and stored in memory as a new intermediate sum in the sum register RS.

This method is continued until such time as all of the weighted capacitors have been measured out and all of the correction values have been calculated.

In the normal conversion phase, the calculating register is used for adding the correction values. A value that is equivalent to the sum of those correction values that are assigned to the weighted capacitors of the converter network that are set to logical 1 must be present at the output of the calibration and correction network.

At the beginning of a conversion phase, the sum register RS is set to zero. In normal conversion, the multiplexer MUX switches the bit outputs of the memory Sp to the bus input A of the adder ADD. If a capacitor is set with the aid of the successive approximation register in the capacitive converter network, then the corresponding correction value is retrieved from the memory Sp and added to the contents of the sum register RS. The result is output at the calibration and correction network. In the successive approximation, the bits are tested successively, beginning with the most significant bit (MSB). To this end, the bit to be tested in the converter network is set to 1. That is, the associated capacitor is switched to positive reference voltage.

Depending on the decision of the comparator K, the bit remains set or is set back to zero. Correspondingly, the addition of the correction values is used for the next addition, and written in as a new value in the sum register RS, or the correction value is discarded, so that the contents of the sum register RS remain unchanged.

In the self-calibrating converter, a disadvantageous situation may arise in which the comparator K may not emit any defined logic potential under some circumstances. That is, the decision of the comparator may not be definitive. This may, for instance, occur at the transition from one code value to the next, in other words, at a code threshold. In the normal case, this causes no problem, since the comparator decision is read into the successive approximation register SAR, and after a brief metastable period this register decides in favor of a logical 0 or a logical 1. In the method of self-calibration according to the invention, in which the correction value is jointly calculated during the conversion, and the adaptation error is corrected in analog fashion, it may occur that calculation is performed with a logical 1, but the successive approximation register SAR decides in favor of a logical 0, which would generate a conversion error. In order to be able to take this metastable state into account, the buffer memory L, which is constructed in the form of a latch, is disposed in the calculating register before the bus input B of the adder ADD. This buffer memory is connected transparently in the calibration phase. At the instant of each bit decision, the result of the previous addition is stored in memory in the sum register RS in any case. The buffer memory is then connected in non-transparent fashion. Then the metastable time of the register elements contained in the successive approximation register is waited out; this takes about 25 ns. If the successively approximation register then decides in favor of a logical 1, the buffer memory is switched transparently for the next one-half clock period. In this way, it becomes possible for the calculated correction value to correspond to the bit pattern in the successive approximation register.

The foregoing is a description corresponding in substance to European Application No. 88 116 235.8, dated Sept. 30, 1988, the International priority of which is being claimed for the instant application, and which is hereby made part of this application. Any material discrepancies between the foregoing specification and the aforementioned corresponding German application are to be resolved in favor of the latter.

I claim:

1. Method for determining and processing correction values according to the principle of successive approximation for self-calibrating A/D and D/A converters, which comprises:

(A) in a calibration phase, beginning with the most significant network element,
   (Aa) measuring error terms with a calibration and correction network controlled by a successive approximation register in combination with a calculating register for each weighted network element of a binary weighted converter network controlled by the successive approximation register, by comparison with the sum of all of the lower-weighted network elements;
   (Ab) calculating a correction value for each weighted network element of the converter network as one-half the difference of the associated error term and the sum of all of the correction values for higher-weighted network elements, with the calculating register having a sum register; and
   (Ac) storing each calculated correction value in a memory; and (B) in a conversion phase, beginning with the most significant network element,
   (Ba) retrieving the associated correction value from the memory and adding the correction value to the contents of the sum register upon setting of a weighted network element,
   (Bb) outputting the correction value at the calibration and correction network; and
   (Bc) adding the correction value to the contents of the sum register or discarding the correction value as a function of a comparator decision.

2. Method according to claim 1, which comprises in the calibration phase, incrementally
   (Ab1) subtracting the contents of the sum register from each error term with the aid of an adder;
   (Ab2) dividing the result by two with a further register; and
   (Ab3) temporarily storing the quotient forming the correction value in the further register.

3. Method according to claim 2, which comprises effecting the subtraction by addition of the two's complement of the contents of the sum register.

4. Method according to claim 2, which comprises adding the correction value temporarily stored in the further register to the contents of the sum register and temporarily storing the correction value as a new value in the sum register, and subsequently performing the next calibration step.

5. Method according to claim 1, which comprises reading the contents of the sum register through a controllable buffer memory into an adder, connecting the buffer memory transparently during the calibration phase with flow control means end connecting the buffer memory non-transparently in the conversion phase during a bit decision of the successive approximation register, except in the event of a bit decision made by the successive approximation register in favor of a logical 1, which effects a brief transparent saturation conduction.

6. In a self-calibrating A/D and D/A converter assembly including:
   a binary weighted converter network, a calibrating and correction network, a calculating register for determining and processing correction values for the converter, a successive approximation register controlling the binary weighted converter network and controlling the calibrating and correction network in combination with the calculating register, and a memory,
   the calculating register comprising:
   an adder having an input side and an output side, a sum register and a further register connected to said output side of said adder, a multiplexer connected to said further register, to the successive approximation register and to the memory, and flow control means for connecting said sum register and said multiplexer to said input side of said adder.

7. Calculating register according to claim 6, wherein said sum register has outputs, and said adder has inputs associate with said sum register and a further transfer input, and including an exclusive OR logic connected between said outputs of said sum register and said inputs of said adder associated with said sum register.

8. Calculating register according to claim 7, wherein the converter includes a comparator, and said exclusive OR logic has an output side, and including a buffer memory controlled by the comparator and connected to said output side of said exclusive OR logic.

9. Calculating register for determining and processing correction values for a self-calibrating A/D and D/A converter assembly including a successive approximation register and a memory, the calculating register comprising an adder having an input side and an output side, a sum register and a further register connected to said output side of said adder, a multiplexer connected to said further register, to the successive approximation register and to the memory, and flow control means for connecting said sum register and said multiplexer to said input side of said adder.

* * * * *